US005307242A

United States Patent [19]

Seibold et al.

[11] Patent Number: 5,307,242

[45] Date of Patent: Apr. 26, 1994

[54] DEVICE FOR ELECTRICALLY CONNECTING SHIELDINGS OF MULTI-POLE PLUGS TO THE GROUND LAYER OF A WIRING BOARD

[75] Inventors: Juergen Seibold, Baierbrunn; Karl Zell, Niederpoecking, both of Fed. Rep. of Germany

[73] Assignee: Siemens Aktiengesellschaft, Munich, Fed. Rep. of Germany

[21] Appl. No.: 864,211

[22] Filed: Apr. 6, 1992

Related U.S. Application Data

[63] Continuation-in-part of Ser. No. 525,857, May 21, 1990, abandoned.

[30] Foreign Application Priority Data

Aug. 10, 1989 [DE] Fed. Rep. of Germany ..... 89114840
Sep. 28, 1989 [DE] Fed. Rep. of Germany ....... 8911590

[51] Int. Cl.[5] .............................................. H05K 9/00

[52] U.S. Cl. .................................... 361/816; 361/785; 361/791; 361/818; 439/108; 439/109; 439/608; 439/609

[58] Field of Search ............... 361/412, 413, 424, 784, 361/785, 786, 788, 791, 816, 818; 439/45, 48, 49, 50, 75, 108, 119, 607, 608, 609, 260, 325

[56] References Cited

U.S. PATENT DOCUMENTS

| | | | |
|---|---|---|---|
| 4,655,518 | 4/1987 | Johnson et al. | 439/108 |
| 4,869,677 | 9/1989 | Johnson et al. | 439/108 |
| 4,871,321 | 10/1989 | Johnson | 439/108 |
| 4,909,743 | 3/1990 | Johnson et al. | 439/80 |

FOREIGN PATENT DOCUMENTS

| | | | |
|---|---|---|---|
| 3624883 | 1/1988 | Fed. Rep. of Germany | 439/64 |

*Primary Examiner*—Leo P. Picard
*Assistant Examiner*—Donald A. Sparks
*Attorney, Agent, or Firm*—Hill, Steadman & Simpson

[57] ABSTRACT

In order to achieve a partial shielding with different shielding potentials, the shieldings per plug are composed of angled-off shields at the solder side and/or at the component side of a printed circuit board, whereby the length of the shields corresponds to the single or, respectively, multiple length of an individual segment of the spring contact housing of the plug. For fastening the shields to the module, the shields have hooks that are engageable into entry funnels of the outer spring chambers of the spring contact housing and also have press-in pins with which they are secured to the printed circuit board. Also, the shields comprise spring sections in the region of the contact blades, the spring sections being outwardly arced, separated from one another by slots and extending parallel to the contact blades.

22 Claims, 4 Drawing Sheets

DEVICE FOR ELECTRICALLY CONNECTING SHIELDINGS OF MULTI-POLE PLUGS TO THE GROUND LAYER OF A WIRING BOARD

CROSS REFERENCE TO RELATED APPLICATION

This is a continuation-in-part application of our prior application, Ser. No. 525,857, filed May 21, 1990 now abandoned.

BACKGROUND OF THE INVENTION

1. Field of the Invention

The present invention relates to a device for electrically connecting shields of multi-pole plugs from a printed circuit board (PCB) or daughter board, having a spring contact housing, to the ground potential layer of a mother board containing a plurality of contact blades residing perpendicularly thereon, whereby spring elements provided at the shields are arranged such that, in the plugged condition of the plugs, they resiliently press against contact blades conductively connected to the ground potential layer of the mother or wiring board.

2. Description of the Prior Art

A device of the type generally set forth above is disclosed, for example, in the European patent application EP 0 203 405 A2. This known device has the disadvantage that either no shielding occurs or the shielding occurs over the length of the entire spring contact housing. A further disadvantage of the known device is that only one shielding potential per spring contact can be employed.

SUMMARY OF THE INVENTION

It is therefore an object of the present invention to provide a device of the type set forth above that enables a partial shielding with different shielding potentials.

For a device of the type set forth above, this object is achieved, according to the present invention, in that the shieldings per plug are composed of a shield angled off at the solder side and/or at the components side of a printed circuit board, in that shield hooks are attached to the individual shields at their side edges and directed towards the wiring or mother board, the shield hooks being engageable into receiving funnels of other spring chambers of the spring contact housing, whereas pres-s-in pins are arranged at the lateral edges of the angled-off portion, the shields being connectable by way of the press-in pins to a grounded potential layer present on the wiring board. The shield comprise spring regions outwardly arced in the region of the contact blades that are separated from one another by slots and extend parallel to the contact blades, the spring regions contacting the individual shields to the contact blades, and the length of the shields corresponds to the single or, respectively, multiple length of an individual segment of the spring contact housing.

As a result of the structuring of the shielding in the device of the present invention, a shield can occur both over the entire length of the spring contact housing, or over only individual segments or, respectively, modules of the spring contact housing. Dependent on the degree of shielding required, furthermore, the component side or the solder side, or both sides together can be optionally shielded at the spring contact housing. Since a shielding of individual segments separated from one another is possible in the device of the present invention, different shielding potentials can also be employed.

Another, equivalent solution of the object of the present invention is provided in that a device of the type generally set forth is particularly characterized in that the shieldings, per plug, are composed of a shield angled off at the solder side and/or at the component side, whereby press-in pins are attached to the lateral edges of the angled-off portion, the shields being connectable with the press-in pins to a grounded potential layer present on the wiring board. The shields are provided with the contact spring arrangements in the regions of the contact blades, the spring arrangement being outwardly arced, separated from one another by slots and secured on the contact blades, and the length of the shields as well as of the spring arrangements corresponds to the single or, respectively, multiple length of an individual segment of the spring contact housing.

As a result of the above construction of shielding in a device constructed in accordance with the present invention, the shielding can occur both over the entire length of the spring contact housing as well as over only individual segments or, respectively, modules of the spring contact housing. Furthermore, dependent on the degree of shielding required, the component side or the solder side or both sides together can be optionally shielded at the spring contact housing. Since a shielding of the individual segments separated from one another is possible in the concept of the present invention, different shielding potentials can also be employed.

According to an advantageous feature of the invention, the device is particularly characterized in that the shields comprise clearances in the region lying parallel to the module printed circuit board. These additionally-provided clearances in the shields allow further shields with which the complete module printed circuit board or parts thereof can be shielded to be hooked in or, respectively, connected.

A further advantageous feature of a device constructed in accordance with the present invention is that the device is particularly characterized in that the shields comprise latches for latching to that side of the spring contact housing facing towards the module printed circuit board. A detachment of the shields during a plug-in or unplugging event is thereby reliably prevented.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
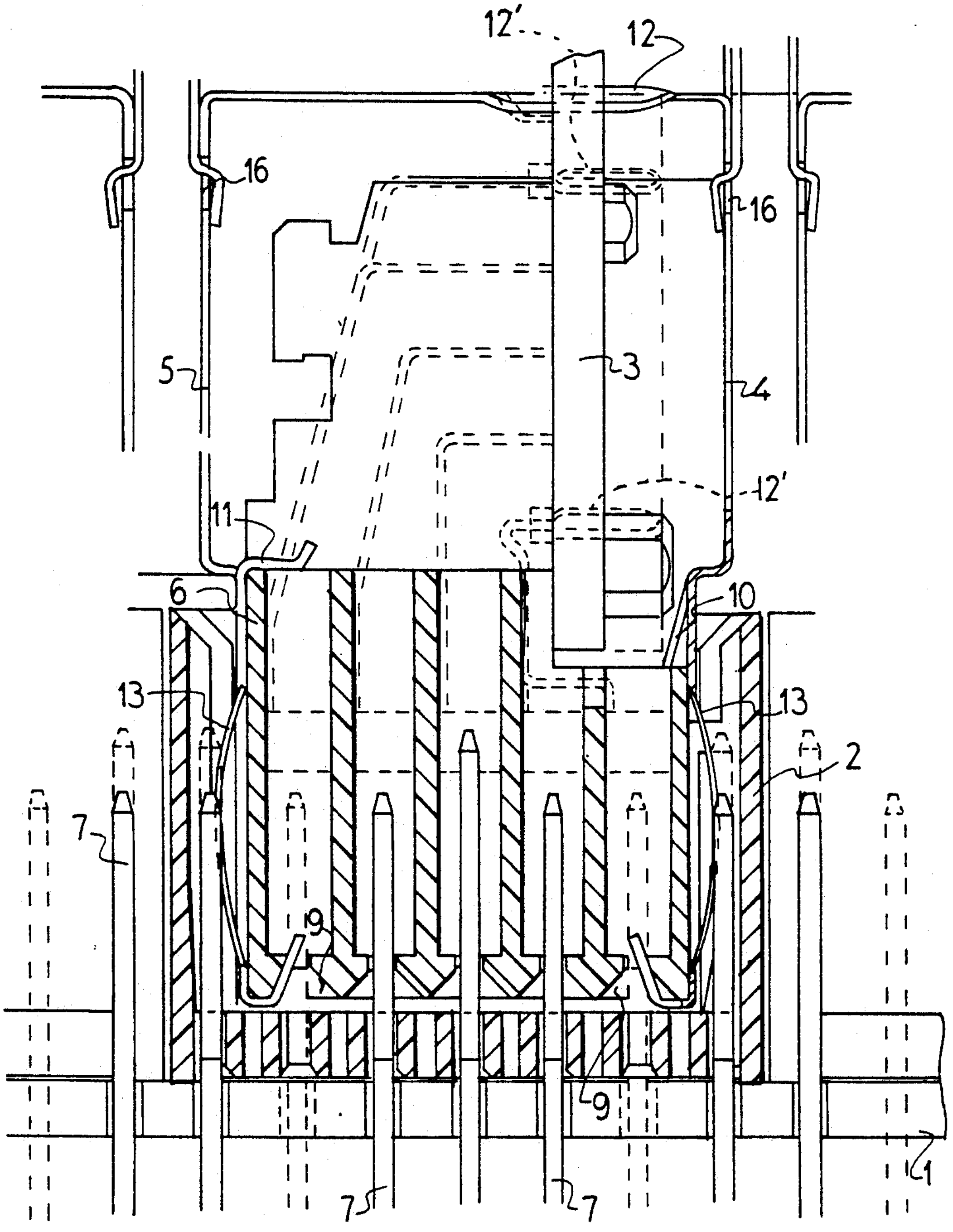
FIG. 1 is a sectional view taken through a device for the electrical connection of shielding of multi-pole plugs connected to a printed circuit or daughter board to the ground layer of a wiring or mother board according to the present invention.

FIG. 1 illustrates a section through a device for the electrical connection of shields of multi-pole plugs of a printed circuit board via and to the ground potential layer of a wiring or mother board in accordance with the present invention. FIG. 1 shows a wiring board 1 having a plurality of contact blades 7 extending perpendicularly therefrom. A centering strip 2 is arranged on the wiring board 1. A spring contact housing 6 that is connected to a module printed circuit board 3 is inserted into the centering strip 2. In the illustrated exemplary embodiment, the shielding function for the spring contact housing 6 on the module is achieved in that shields 4 and 5 are mounted thereon. The shield 4 is the shield for the solder side of the printed circuit board 3 and the shield 5 is the shield for the component side of the printed circuit board 3.

Dependent on the required degree of shielding, therefore, the component side or the solder side, or both sides together can be optionally provided with shields.

Figure 3:
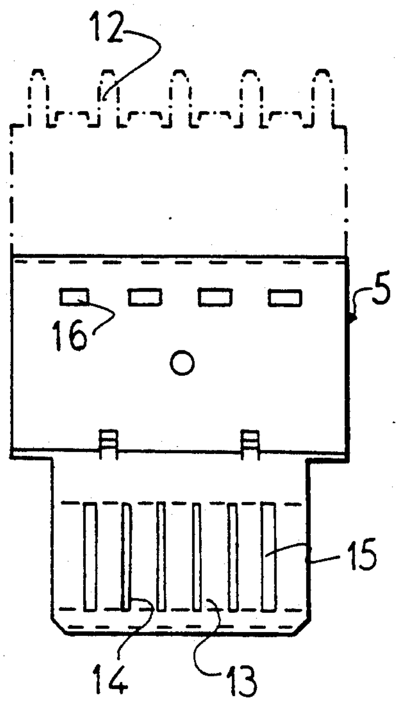
FIG. 3 is a plan view of a shield for the component side of a printed circuit board and hinged or bent into a plane.
Figure 2:
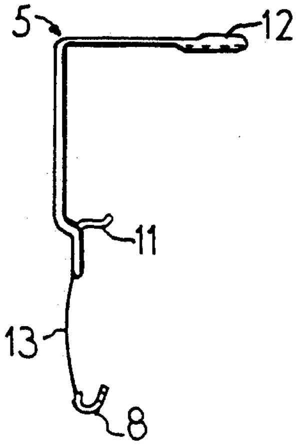
FIG. 2 is a side view of a shield at the component side of a printed circuit board.
Figure 5:
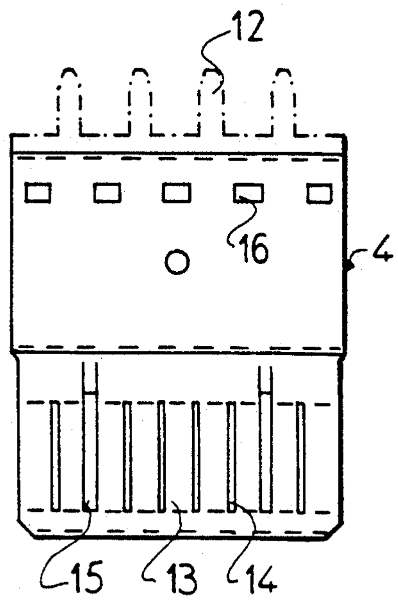
FIG. 5 is a plan view of a shield for the component side of a printed circuit board, according to FIG. 1, and shown hinged or bent into a plane.
Figure 4:
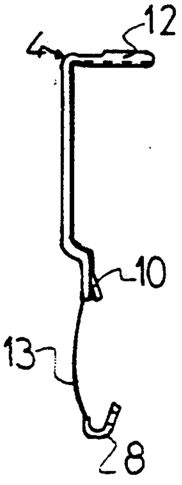
FIG. 4 is a side view of a shield for the solder side of a printed circuit board.

More detailed illustrations of the shields 4 and 5 are provided in FIGS. 2–5. FIGS. 3 and 5 thereby illustrate shields having the length of a module of the spring contact or, respectively, of the spring contact housing 6. The length of the shields, however, can be a whole multiple of this basic length up to the overall length of the spring contact housing 6 (not shown here).

The fastening of the shields 4 and 5 occurs in multiple. First, the individual shields 4 and 5 are provided with shield hooks at their lateral edges extending in the direction of the wiring board 1. These shield hooks 8 engage into receiving funnels 9 of outer spring chambers of the spring contact housing 6. Press-in pins 12 with which the shields 4 and 5 are connected to the module printed circuit board are attached to the lateral edges of the angled-off portions of the shields. The electrical connection of the shields to the module printed circuit board thereby occurs with a proven press-in technique in the plated-through holes 12', whereby the press-in pins have an elastic press-in region. The press-in pins of the two shields thereby engage comb-like into one another. At the same time, the shields 4 and 5 are held at that side of the spring contact housing 6 facing towards the module printed circuit board 3, being held thereat with catches such as catch tongues 10 at the shield 4 of the solder side and catch hooks 11 at the shield 5 of the component side. Protection against unintentional detachment of the shields 4 and 5 during a plugging or unplugging event is thereby guaranteed.

The contacting of the shields 4 and 5 to the contact blades 7 occurs via spring regions 13 separated by slots 14. The spring regions 13 are produced in that this region is milled thinner during the manufacturing process and is pre-bent in a further working cycle. The arced spring regions 13 of the shields 4 and 5 separated by the slots 14 enable mutually-independent electrical connections to the contact blades 7 that are, in turn, connected via the plated-through holes 12' to the ground potential layer of the wiring board 1.

Individual, broadened slots 15 between the spring regions enable a pre-centering or, respectively, guidance of the shielded spring clip 6 within a centering strip 2.

Additional clearances 16 at the shields 4 and 5 allow further shields with which the complete module or parts thereof can be shielded to be hooked in or, respectively, connected. The spring contact housings are thereby constructed such that a subsequent equipping with shields can occur at any time.

Figure 6:
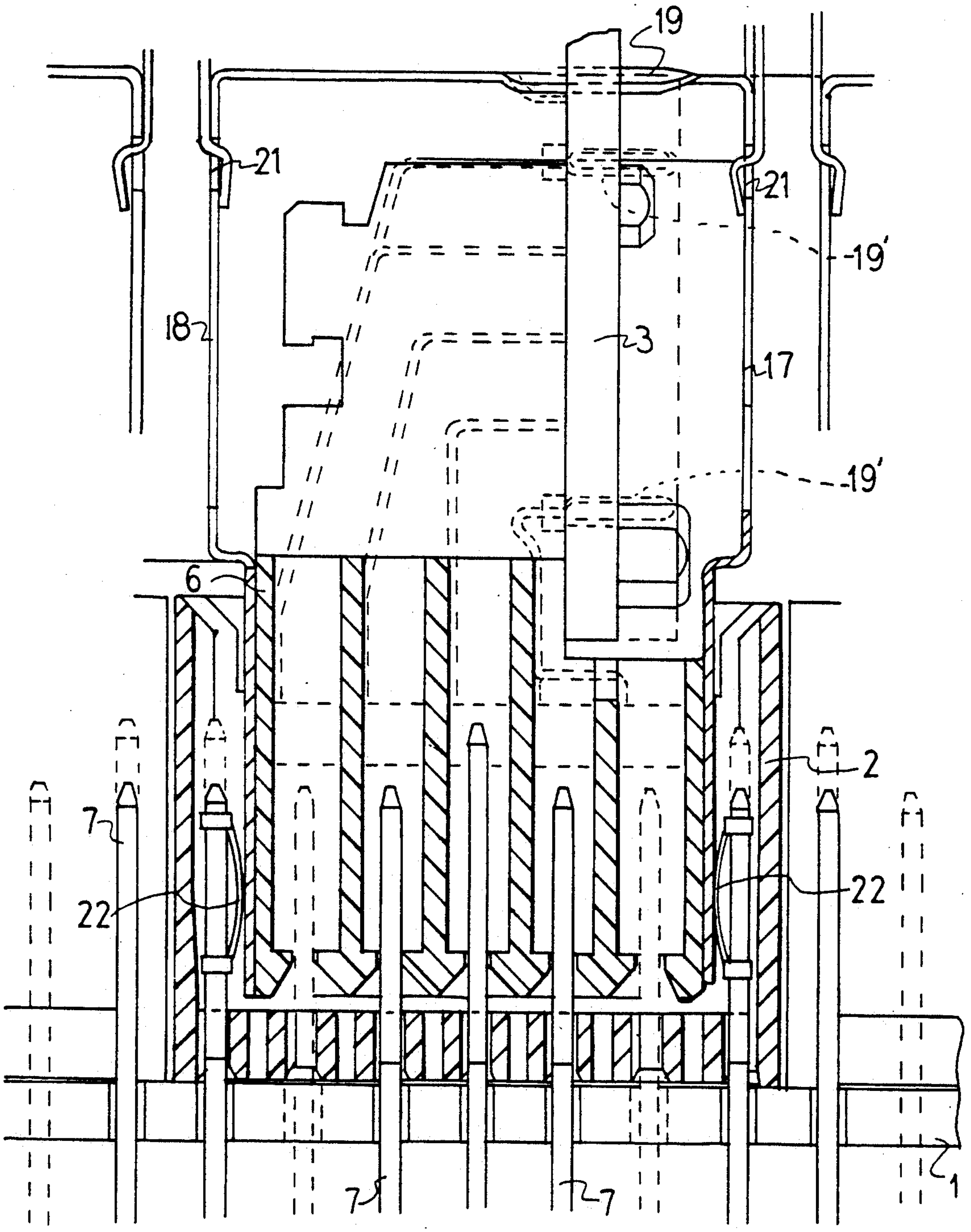
FIG. 6 is a sectional view through a device for the electrical connection of shieldings of multi-pole plugs to the ground layer of a wiring board according to the present invention.

FIG. 6 illustrates a section through a device for the electrical connection of shields of multi-pole plugs to the ground layer of a wiring board, in accordance with the present invention. The figure likewise illustrates a wiring board 1 having the contact blade 7, whereby a centering strip 2 is arranged on the wiring or mother board. A spring contact housing 6 that is connected to a module printed circuit board 3 is inserted into the centering strip 2. In the illustrated exemplary embodiment, the shielding function for the spring contacts on the module is achieved in that shields 17 and 18 are mounted. The shield 17 is the shield of the solder side and the shield 18 is the shield of the component side.

Dependent on the required degree of shielding, therefore, the components side or the solder side or both sides together can be optionally provided with shields.

Figure 7:
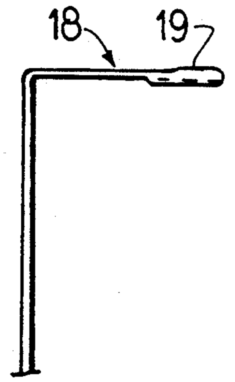
FIG. 7 is a side view of a shield for the component side of a printed circuit board.
Figure 8:
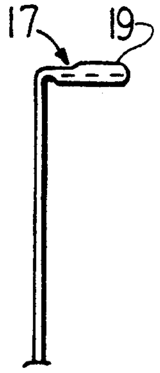
FIG. 8 is a side view of a shield for the solder side of a printed circuit board.
Figure 9:
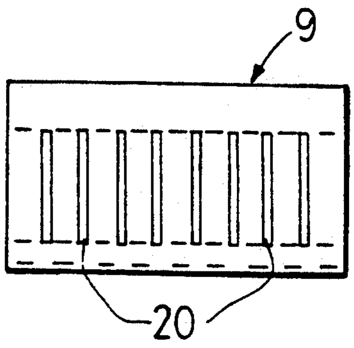
FIG. 9 is a plan view onto a spring arrangement of the shielding device of FIG. 6.

More detailed illustrations of the shields 17 and 18 are contained in FIGS. 7 and 8. The fastening of the shields 17 and 18 can occur in a different manner known to one of ordinary skill in the art that shall not be shown here. Press-in pins 19 with which the shields 17 and 18 are connected to the module printed circuit board via the plated-through holes 19' and attached to the lateral edges of the angled-off portions of the shields. The electrical connection of the shields to the module printed circuit board thereby occurs with a proven press-in technique, whereby the press-in pins comprise an elastic press-in region.

The contacting of the shields 17 and 18 to the contact blades 7 occurs via spring arrangements 22 separated by slots 20. The spring arrangements 22 compromise outwardly-arced spring tongues that contact the shields and are secured to the contact blade 7. The fastening, for example, can occur by plug-on or by pinching. The length of the spring arrangement just like the length of the shields corresponds either to the single or, respectively, multiple length of an individual segment of the spring contact housing.

Additionally-provided clearances 21 at the shields 17 and 18 allow further shields with which the complete modules or portions thereof can be shielded to be hooked in or, respectively, connected.

Although we have described out invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. Shielding apparatus in combination with a multi-pole plug, a wiring board and a printed circuit board, comprising:

a ground layer carried on said wiring board;

plated-through holes carried on said printed circuit board carrying respective potentials to be employed as shielding potentials;

a plurality of contact blade locations and a plurality of contact blades extending perpendicular from said wiring board arranged spaced apart in at least one row, said contact blades located at respective ends of said at least one row connected to said ground layer and constituting first and second grounded contact blades;

a solder side and a component side on said printed circuit board;

said multi-pole plug comprising an insulating housing including walls defining a plurality of chambers arranged complementary to the arrangement of said contact blades and each of said chambers including a funnel-shaped opening for receiving a contact blade therethrough;

a plurality of spring contacts individually located in those chambers which do not correspond to said first and second grounded contacts of said at least one row of contact blades for receiving and electrically contacting a respective contact blade, the chambers adjacent the locations of said first and second grounded contacts being vacant, each of said spring contacts connected to a respective location on said printed circuit board and extending thereto on said component side of said printed circuit board;

centering and guide means including a first wall adapted to lie against said wiring board and including a plurality of apertures receiving said contact blades therethrough, and wall means extending perpendicular to said first wall and defining a cavity for receiving the multi-hole plug and, in the plugged condition, spaced from said insulating housing to define first and second spaces therebetween opened by a respective aperture of said first wall to receive said first and second grounded contact blades therein, respectively; and first and second conductive shields, respectively, for said solder side and said component side of said printed circuit board, each of said shields including a first portion extending perpendicular to and electrically connected to at least one plated-through hole and its potential on said printed circuit board, and a second portion extending at an angle to said first portion and into a respective one of said first and second spaces, said second portion including a digital hook section comprising at least one hook at its distal end engaging in a respective one of said first and second vacant chambers and a spring section adjacent said digital hook section for resiliently engaging and electrically contacting a respective one of said first and second contact blades; wherein said printed circuit board is part of a circuit module; and a plurality of further shields each including at least one hook; and at least one aperture in said second portions of each of said first and second shields retaining respective ones of said hooks to connect said further shields to said first and second shields as extensions thereof to provide additional shielding for said module.

2. The shielding combination of claim 1, wherein:

said plug housing includes shoulders parallel to the wiring board; and each of said first and second shields comprises at least one retention tongue on said second portion engaging a respective shoulder.

3. The shielding combination of claim 1, wherein:

each of said first portions of said first and second shields comprises yieldable plug-in pins engaging said plated-through holes.

4. The shielding combination of claim 3, wherein:

each of said yieldable plug-in pins on said first shield comprises a shape complementary to a corresponding yieldable plug-in pin on said second shield for engagement therewith in the same plated-through hole.

5. The shielding combination of claim 1, wherein:

said spring section comprises a spring bow arced towards the respective contact blade.

6. The shielding combination of claim 5, wherein:

said spring bow comprises a thickness that is less than the thickness of the remainder of the respective shield.

7. The shielding combination of claim 1, wherein:

said plug housing wall further defines chambers arranged in columns and rows;

said contact blades are arranged in corresponding columns and rows and include a plurality of said first and second grounded contact blades aligned in respective columns; and said spring sections of each of said shields comprises a plurality of connected aligned arcuate spring bows separated by spaces and engaging the first and second contact blades of a respective column.

8. Shielding apparatus including a combination of a multi-pole plug, a wiring board and a printed circuit board and at least one shield, and comprising:

a ground layer carried on said wiring board;

plated-through holes carried on said printed circuit board and carrying respective potentials for use in shielding potentials;

a plurality of contact blades extending perpendicular from said wiring board arranged spaced apart in at least one row, first and second ones of said contact blades located at respective ends of said at least one row and connected to said ground layer and constituting first and second grounded contact blades;

a solder side and a component side of said printed circuit board;

said multi-pole plug comprising an insulating housing including walls defining a plurality of chambers arranged complementary to the arrangement of said contact blades and each of said chambers including a funnel-shaped opening for receiving a contact blade therethrough;

a plurality of spring contacts individually located in those chambers which do not correspond to the ends of said at least one row for receiving and electrically contacting a respective contact blade, each of said spring contacts connected to a respective location on said printed circuit board and extending thereto on said component side of said printed circuit board;

centering and guide means including a first wall adapted to lie against said wiring board and including a plurality of apertures receiving said contact blades therethrough, and wall means extending perpendicular to said first wall and defining a cavity for receiving said multi-pole plug and, in the plug condition, spaced from said insulating housing to define first and second spaces therebetween opened by a respective aperture of said first wall to receive said first and second grounded contact blades, respectively;

first and second conductive shields for said solder side and said component side, respectively, of said printed circuit board, each of said shields including a first portion extending perpendicular to and electrically connected to at least one plated-through hole and its potential on said printed circuit board, and a second portion extending at an angle to said first portion and, together with the like second portion of the other shield, embraceably engaging said plug housing; and first and second spring means electrically connecting said first and second shields to the respective first and second contact blades; wherein said printed circuit board is part of a circuit module; and a plurality of further shields each including at least one hook; and at least one aperture in said second portions of each of said first and second shields retaining respective ones of said hooks to provide additional shielding for said module.

9. The shielding apparatus of claim 8, wherein:

each of said first and second spring means comprises a spring including a bow arced towards and engaging the respective shield and mounting means mounting said spring to the respective contact blade.

10. The shielding apparatus of claim 8, wherein:

each of said first portions of said first and second shields comprises plug-in pins for plugging into said plated-through holes.

11. The shielding apparatus of claim 10, wherein:

each of said plug-in pins on said first shield comprises a shape complementary to a corresponding plug-in pin on said second shield for engagement therewith in the same plated-through hole.

12. A shielding arrangement comprising:

a wiring board having a ground layer;

a printed circuit board having a solder side and a component side and carrying respective potentials to be employed as shielding potentials, and having plated-through holes;

a plurality of contact blades extending perpendicular from said wiring board arranged spaced apart in at least one row;

first and second grounded contact blades located at respective ends of said at least one row connected to said ground layer;

a multi-pole plug comprising an insulating housing including walls defining a plurality of chambers arranged complimentary to the arrangement of said contact blades and each of said chambers including an opening for receiving a contact blade therethrough;

a spring contact located in one of said chambers for receiving and electrically contacting a respective contact blade, the chambers adjacent the locations of said first and second grounded contact blades being vacant, said spring contact connected to a respective location on said printed circuit board and extending thereto on said component side of said printed circuit board;

centering and guide means including a first wall adapted to lie against said wiring board and including a plurality of apertures receiving said contact blades therethrough, and wall means extending perpendicular to said first wall and defining a cavity for receiving the multi-hole plug and, in the plug in condition, spaced from said insulating housing to define first and second spaces therebetween opened by a respective aperture of said first wall to receive said first and second grounded contact blades therein, respectively; and first and second conductive shields, respectively, for said solder side and said component side of said printed circuit board, each of said shields including a first portion extending perpendicular to and electrically connected to at least one plated-through hole and its potential on said printed circuit board, and a second portion extending at an angle to said first portion and into a respective one of said first and second spaces, said second portion including a digital hook section comprising at least one hook at its distal end engaging in a respective one of said first and second vacant chambers, and a spring section adjacent said digital hook section for resiliently engaging and electrically contacting a respective one of said first and second contact blades;

a plurality of further shields each including at least one hook; and at least one aperture in said second portions of each of said first and second shields retaining respective ones of said hooks to provide additional shielding for said printed circuit board.

13. The shielding combination according to claim 12, wherein:

said plug housing includes shoulders parallel to the wiring board; and each of said first and second shields comprises at least one retention tongue on said second portion engaging a respective shoulder.

14. The shielding combination according to claim 12, wherein:

said first portion of said first shield comprising a plug-in pin, and said first portion of said second shield comprises a complementary plug-in pin, said plug-in pin and said complementary plug-in pin engageable into the same plated-through hole.

15. The shielding combination according to claim 12, wherein:

said spring section comprises a spring bow arced towards the respective grounded contact blade.

16. A shielding arrangement comprising:

a wiring board having a plurality of contact blades extending perpendicular from said wring board, and first and second grounded contact blades;

a printed circuit board carrying respective potentials to be employed as shielding potentials;

a multi-pole plug comprising an insulated housing surrounding a plurality of chambers arranged complementary to the arrangement of said contact blades, each of said chambers including an opening for receiving a contact blade therethrough;

a spring contact located in one of said chambers for receiving and electrically contacting a respective contact blade, said spring contact electrically connected to a location on said printed circuit board;

socket means surrounding said contact blades and said first and second grounded contact blades, and adapted to mate with said plug housing; and first and second conductive shields, respectively, for opposite sides of said printed circuit board, each of said shields including a first portion extending perpendicular to and electrically connected to a respective shielding potential on said printed circuit board, and a second portion extending at an angle to said first portion and into said socket means, said second portion including a hook means engaging said insulating housing of said multi-pole plug, and a spring section adjacent said hook means for resiliently engaging and electrically contacting a respective one of said first and second grounded contact blades; and a plurality of further shields each including at least one hook;

at least one aperture in said second portions of each of said first and second shields retaining respective ones of said hooks to connect said further shields to said first and second shields as extensions thereof to provide additional shielding for said printed circuit board.

17. The shielding combination according to claim 16, wherein:

said plug housing includes shoulders parallel to the wiring board; and each of said first and second shields comprises at least one retention tongue on said second portion engaging a respective shoulder.

18. The shielding combination according to claim 15, wherein:

said first portion of said first shield comprising a plug-in pin, and said first portion of said second shield comprises a complementary plug-in pin, said plug-in pin and said complementary plug-in pin engageable into the same plated-through hole.

19. The shielding arrangement according to claim 18, wherein said first and second electrical ground contact are arranged between sidewalls of said first plug member and said second plug member respectively.

20. A shielding arrangement comprising:

a wiring board;

a printed circuit board mounted perpendicularly with respect to said wiring board, said printed circuit board having at least one shielding potential carried thereon;

a first plug member mounted onto said wiring board and having first exposed electrical contacts, and having a first ground contact and a second ground contact arranged on opposite lateral sides within said plug member;

a second plug member having a plurality of second exposed electrical contacts arranged for electrically connecting with said first exposed electrical contacts when said first plug member is mated with said second plug member, said second plug member having electrical connections between said second exposed electrical contacts and respective locations on said printed circuit board; and first and second conductive shields arranged on opposite sides of said printed circuit board, each of said shields including a first portion extending perpendicular to, and electrically connected to, a shielding potential on said printed circuit board, and a second portion extending toward said wiring board and resiliently engaging one of said first and second ground contacts respectively, and a third portion comprising a shielding surface, said third portions of said first and second conductive shields covering opposite surface sides of said locations on said printed circuit board;

a plurality of further shields each including at least one hook; and at least one aperture in said second portions of each of said first and second shields retaining respective ones of said hooks to provide additional shielding for said printed circuit board.

21. The shielding arrangement according to claim 20, wherein said second portions comprise hooks at their distal ends for engaging with said second plug member.

22. The shielding arrangement according to claim 20, wherein said first portions comprise compatibly shaped press pins, and said printed circuit board comprises plated through holes, said first portions interfit into the same plated through hole from opposite sides of said printed circuit board.

* * * * *